US011176978B2

(12) United States Patent
Kawamura

(10) Patent No.: US 11,176,978 B2
(45) Date of Patent: *Nov. 16, 2021

(54) APPARATUSES AND METHOD FOR REDUCING ROW ADDRESS TO COLUMN ADDRESS DELAY

(71) Applicant: Micron Technology, Inc., Boise, ID (US)

(72) Inventor: Christopher Kawamura, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/035,462

(22) Filed: Sep. 28, 2020

(65) Prior Publication Data

US 2021/0027821 A1    Jan. 28, 2021

Related U.S. Application Data

(63) Continuation of application No. 16/191,428, filed on Nov. 14, 2018, now Pat. No. 10,790,000.

(51) Int. Cl.
*G11C 8/18* (2006.01)
*G11C 7/06* (2006.01)
*G11C 7/12* (2006.01)
*G11C 8/10* (2006.01)
*G11C 8/08* (2006.01)

(52) U.S. Cl.
CPC .................. *G11C 8/18* (2013.01); *G11C 7/06* (2013.01); *G11C 7/12* (2013.01); *G11C 8/08* (2013.01); *G11C 8/10* (2013.01)

(58) Field of Classification Search
CPC .... G11C 8/18; G11C 7/06; G11C 7/12; G11C 8/10; G11C 8/08; G11C 2207/2272; G11C 11/4091; G11C 11/4094; G11C 11/4085; G11C 11/4087; G11C 5/063; G11C 8/14; G11C 7/08
USPC ......................................................... 365/194
See application file for complete search history.

(56) References Cited

U.S. PATENT DOCUMENTS

| 9,202,555 | B2* | 12/2015 | Jung ..................... G11C 11/419 |
| 10,665,294 | B2* | 5/2020 | Walker .................. G11C 11/412 |
| 2017/0032830 | A1* | 2/2017 | Lee ...................... G11C 11/4074 |
| 2020/0152249 | A1 | 5/2020 | Kawamura | |

* cited by examiner

*Primary Examiner* — Fernando Hidalgo
(74) *Attorney, Agent, or Firm* — Dorsey & Whitney LLP

(57) ABSTRACT

Apparatuses and methods for reducing row address (RAS) to column address (CAS) delay (tRCD) are disclosed. In some examples, tRCD may be reduced by providing a non-zero offset voltage to a target wordline at an earlier time, such as during a threshold voltage compensation phase of a sense operation. Setting the wordline to a non-zero offset voltage at an earlier time may reduce a time for the wordline to reach an activation voltage, which may reduce tRCD. In other examples, protection against row hammer attacks during precharge phases may be improved by setting the wordline to the non-zero offset voltage.

20 Claims, 12 Drawing Sheets

APPARATUSES AND METHOD FOR REDUCING ROW ADDRESS TO COLUMN ADDRESS DELAY

CROSS-REFERENCE TO RELATED APPLICATION (S)

This application is a continuation of U.S. patent application Ser. No. 16/191,428 filed on Nov. 14, 2018 issued as U.S. Pat. No. 10,790,000 on Sep. 29, 2020. This application and patent are incorporated by reference herein in their entirety and for all purposes.

BACKGROUND

High data reliability, high speed of memory access, and reduced chip size are features that are demanded from semiconductor memory. In recent years, there has been an effort to further increase the clock speed of memories without sacrificing reliability, which, for a fixed number of clock cycles, effectively reduces an absolute time period available to perform a memory operation. One area of a memory access operation that is independent of the faster clock speeds is the time it takes to charge and discharge access lines during a memory access operation. As clock speeds increase, charging and discharging of access lines may consume an increasingly larger share of allotted time to perform some memory access operations. One time period of a memory access operation that helps define a total latency within a memory to provide data from a memory cell at an output is a minimum row address (RAS) to column address (CAS) delay, or tRCD. The tRCD is a minimum number of clock cycles required between activating a row of memory and accessing a memory cell in a column of the memory cells coupled to the activated row. Reducing the tRCD may provide more time margin for a memory device.

DETAILED DESCRIPTION OF THE EMBODIMENTS

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessarily mutually exclusive, as some disclosed embodiments can be combined with one or more other disclosed embodiments to form new embodiments.

Figure 1:
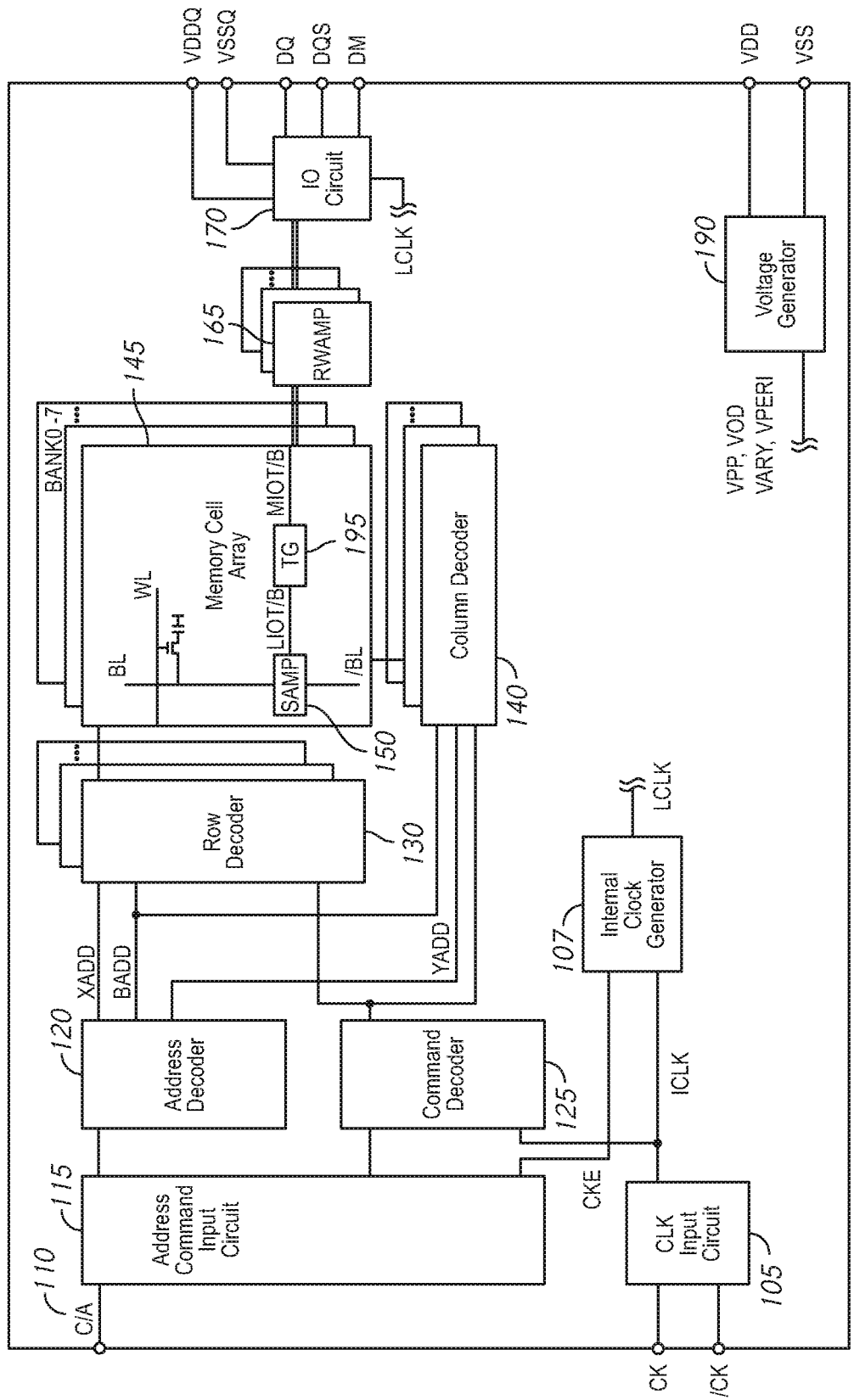
FIG. 1 is a schematic block diagram of a semiconductor device, in accordance with an embodiment of the present disclosure.

FIG. 1 is a schematic block diagram of a semiconductor device 100, in accordance with an embodiment of the present disclosure. The semiconductor device 100 may include a clock input circuit 105, an internal clock generator 107, an address command input circuit 115, an address decoder 120, a command decoder 125, a plurality of row (e.g., first access line) decoders 130, a memory cell array 145 including sense amplifiers 150 and transfer gates 195, a plurality of column (e.g., second access line) decoders 140, a plurality of read/write amplifiers 165, an input/output (I/O) circuit 170, and a voltage generator 190. The semiconductor device 100 may include a plurality of external terminals including address and command terminals coupled to command/address bus 110, clock terminals CK and /CK, data terminals DQ, DQS, and DM, and power supply terminals VDD, VSS, VDDQ, and VSSQ. The terminals and signal lines associated with the command/address bus 110 may include a first set of terminals and signal lines that are configured to receive the command signals and a separate, second set of terminals and signal lines that configured to receive the address signals, in some examples. In other examples, the terminals and signal lines associated with the command and address bus 110 may include common terminals and signal lines that are configured to receive both command signal and address signals. The semiconductor device may be mounted on a substrate, for example, a memory module substrate, a motherboard or the like.

The memory cell array 145 includes a plurality of banks BANK0-N, where N is a positive integer, such as 3, 7, 15, 31, etc. Each bank BANK0-N may include a plurality of word lines WL, a plurality of bit lines BL, and a plurality of memory cells MC arranged at intersections of the plurality of word lines WL and the plurality of bit lines BL. The selection of the word line WL for each bank BANK0-N is performed by a corresponding row decoder 130 and the selection of the bit line BL is performed by a corresponding column decoder 140. The plurality of sense amplifiers 150 are located for their corresponding bit lines BL and coupled to at least one respective local I/O line further coupled to a respective one of at least two main I/O line pairs, via transfer gates TG 195, which function as switches. The sense amplifiers 150 and transfer gates TG 195 may be operated based on control signals from decoder circuitry, which may include the command decoder 120, the row decoders 130, the column decoders 140, any control circuitry of the memory cell array 145 of the banks BANK0-N, or any combination thereof. In some examples, the tRCD for the semiconductor device 100 may involve operations of the row decoders 130, the column decoders 140, and circuitry of the memory cells array 145 of each of the plurality of banks BANK0-N (e.g., including the plurality of sense amplifiers 150 and the transfer gates TG 195). In some examples, the plurality of sense amplifiers 150 may include threshold voltage compensation circuitry that compensates for threshold voltage differences between components of the sense amplifiers 150. As circuit components become smaller, clock speeds become faster, and voltage/power consumption requirements are reduced, small variance between circuit components introduced during fabrication (e.g., process, voltage, and temperature (PVT) variance) may reduce operational reliability of the semiconductor device 100. To mitigate effects of these variations, compensating for some of these threshold voltage Vt differences may include, before activating the sense amplifier 150 to sense data, biasing bit lines BL and /BL coupled to the sense amplifiers 150 using internal nodes of the sense amplifier. 150 that are configured to provide sensed data to an output (e.g., gut nodes). The bias of the bitlines BL and /BL may be based on threshold differences between at least two circuit components (e.g., transistors) of the sense amplifier 150. While compensating for threshold voltage Vt differences between circuit components within the sense amplifier 150 may improve reliability, adding an additional phase (e.g., the threshold voltage compensation phase) to a sense operation may increase the tRCD.

In some examples, adjusting or changing timing of steps of some operations of a sense operation may improve tRCD. For example, the memory cell array 145 and the plurality of sense amplifiers 150 may operate in two general phases or modes. A first phase (e.g., precharge phase) may be initiated in response to a precharge command PRE. During the precharge phase, the wordlines WL may be typically set to an inactive state, and bit lines BL and /BL and internal nodes of the plurality of sense amplifiers 150 that are configured to provide a sensed data state to an output (e.g., gut nodes) may be precharged to and held at a precharge voltage, such as a bit line precharge voltage VBLP, until transitioning to a second phase. That is, the precharge phase may initialize the circuitry of the memory cell array 145 to be ready to start a memory access operation. A second phase (e.g., activation phase) may be initiated in response to an activate command ACT. In some examples, reducing an activation time for a wordline WL may improve tRCD during the second phase. For example, wordline drivers of the row decoders 130 may include multiplexed wordline drivers that include both n-type and p-type transistors on an activate side to improve transition timing. The multiplexed drivers may provide faster activation voltage transition as compared with non-multiplexed drivers. In addition, a non-zero offset voltage may be applied to the wordline WL during the threshold voltage compensation phase of a sense operation, followed by application of a wordline activation voltage after the threshold voltage compensation phase. Applying the offset voltage to the wordline WL during the threshold voltage compensation phase may reduce an activation time for the wordline as the offset voltage reduces wordline WL activation voltage gain as compared with applying a reference or ground voltage to the wordline WL until the threshold voltage compensation phase is complete. That is, providing the non-zero offset voltage to the wordline WL at an earlier time (e.g., such as during the threshold voltage compensation phase), the wordline WL voltage gain sufficient to enable (e.g.; activate) access devices of the corresponding row of memory cells MC (e.g., activation voltage) may be reduced such that the activation voltage is reached at an earlier time. The earlier activation of the wordline WL may allow earlier activation of the plurality of sense amplifiers 150 to sense and latch data states of the row of memory cells, as compared with waiting to initiate activation of the wordline WL until a later time period (e.g., such as after the threshold voltage compensation phase has completed). Thus, by applying the non-zero offset voltage to the wordlines WL during the threshold voltage compensation phase, the sense operation time may be condensed into a shorter time period, and reduce tRCD. In addition, to protect against row hammer attacks, the non-zero offset may be applied to one or more wordlines during the first phase (e.g., the precharge phase).

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and generate various internal command signals. For example, the internal command signals may include a row command signal to select a word line, or a column command signal, such as a read command or a write command, to select a bit line.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, DQS and DM together with a data strobe signal at DQS and a data mask signal at DM. Similarly, when the write command is issued and a row address and a column address are timely supplied with the write command, and then the input/output circuit 170 may receive write data at the data terminals DQ, DQS, DM, together with a data strobe signal at DQS and a data mask signal at DM and provide the write data via the read/write amplifiers 165 to the memory cell array 145. Thus, the write data may be written in the memory cell designated by the row address and the column address.

Turning to the explanation of the external terminals included in the semiconductor device 100, the clock terminals CK and /CK may receive an external clock signal and a complementary external clock signal, respectively. The external clock signals (including complementary external clock signal) may be supplied to a dock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170 and a timing generator 109. The IO circuit 170 may use the phase controller internal clock signal LCLK as a timing signal for determining an output timing of read data. The timing generator 109 may receive the internal clock signal ICLK and generate various internal clock signals.

The power supply terminals may receive power supply voltages VDD and VSS.

These power supply voltages VDD and VSS may be supplied to a voltage generator circuit 190. The voltage generator circuit 190 may generate various internal voltages, VPP, VOD, VARY, VPERI, P1, P2, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. In some examples, voltages P1 and P2 may be equal to a respective one of the internal voltages VPP, VOD, VARY, VPERI. The IO circuit 170 may receive the power supply voltages VDD and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170.

Figure 2:
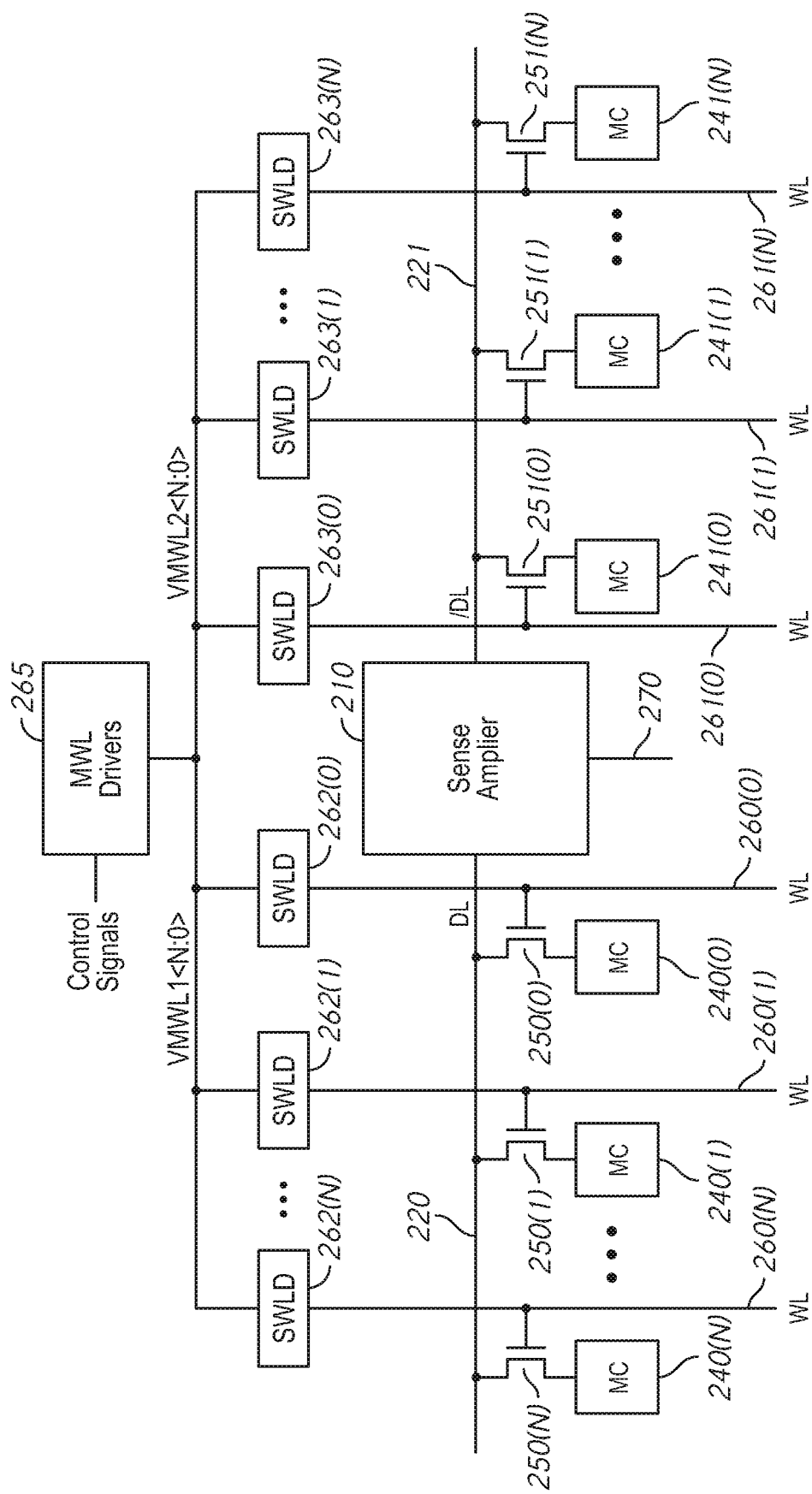
FIG. 2 is a schematic diagram of a sense amplifier and a pair of complementary digit lines in accordance with an embodiment of the disclosure.

FIG. 2 is a schematic diagram of a portion of a memory 200 that includes a sense amplifier 210 and a pair of complementary digit lines DL 220 and /DL 221 in accordance with an embodiment of the disclosure. As shown in FIG. 2, the sense amplifier 210 is coupled to the pair of true and complementary digit (or bit) lines DL 220 and /DL 221. The memory cells 240(0)-(N) may be selectively coupled through respective access devices (e.g., transistors) 250(0)-(N) to the digit line DL 220 and memory cells 241(0)-(N) may be selectively coupled through respective access devices (e.g., transistors) 251(0)-(N) to the digit line /DL 221. Wordlines WL 260(0)-(N) may control which of the memory cells 240(0)-(N) is coupled to the digit line DL 220 by controlling a gate of a respective access device 250(0)-(N). Similarly, wordlines WL 261(0)-(N) may control which of the memory cells 241(0)-(N) is coupled to the digit line DL 221 by controlling a gate of a respective access device 251(0)-(N). Voltages provided to the WL 260(0)-(N) may be driven by the sub-wordline drivers 262(0)-(N), respectively. Similarly, voltages provided to the WL 261(0)-(N) may be driven by the sub-wordline drivers 263(0)-(N), respectively. The sub-wordline drivers 262(0)-(N) and 263(0)-(N) may be controlled via main wordline voltage signals VMWL1<N:0> and VMWL2<N:0> provided by one or more main wordline drivers 265. The main wordline drivers 265 may drive voltages on the VMWL1<N:0> and VMWL2<N:0> signals based on control signals received from decoder circuits, such as any of an address decoder (e.g., the address decoder 120 of FIG. 1), a command decoder (e.g., the command decoder 125 of FIG. 1), a row decoder (e.g., the row decoder 130 of FIG. 1), memory array control circuitry (e.g., the control circuitry of the memory cell array 145 of the memory banks BANK0-N of FIG. 1), or any combination thereof. The sense amplifier 210 may be controlled via control signals 270 received via a decoder circuit, such as any of a command decoder, the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0-N of FIG. 1), or any combination thereof.

In operation, a memory cell of the memory cells 240(0)-(N) is coupled to the digit line DL 220 through the respective access device 250(0)-(N) in response to a respective word line 260(0)-(N) being set to an active state (e.g., the respective access device 250(0)-(N) is enabled) via the respective the sub-wordline driver 262(0)-(N) based on the respective VMWL1<N:0> signal from the main wordline drivers 265 based on received control signals. A data state stored by the memory cell is sensed and amplified by the sense amplifier 210 to drive the digit line DL 220 to a high or low voltage level corresponding to the sensed data state. The other digit line /DL 221 is driven to the complementary voltage level during the sense operation.

Similarly, a memory cell of the memory cells 241(0)-(N) is coupled to the digit line DL 221 through the respective access device 251(0)-(N) in response to a respective word line 261(0)-(N) being set to an active state (e.g., the respective access device 251(0)-(N) is enabled) via the respective the sub-wordline driver 263(0)-(N) based on the respective VMWL2<N:0> signal from the main wordline drivers 265 based on received control signals. A data state stored by the memory cell is sensed and amplified by the sense amplifier 210 to drive the digit line /DL 221 to a high or low voltage level corresponding to the sensed data state. The other digit line DL 220 is driven to the complementary voltage level during the sense operation.

In some examples, sense amplifier 210 may include threshold voltage compensation circuitry that compensates for threshold voltage differences between components of the sense amplifier 210 during a sense operation. To perform the threshold voltage compensation, the sense amplifier 210 may, during a compensation phase of a sense operation, precharge or bias the digit lines DL 220 and /DL 221 such that a voltage difference between the digit line DI, 220 and the /DL 221 is approximately equal to threshold voltage differences between at least two circuit components of the sense amplifier 210. In some examples, the threshold voltage difference may be based on threshold voltages of Nsense transistors of the sense amplifier 210. While compensating for threshold voltage Vt differences between circuit components within the sense amplifier 150 may improve reliability, adding an additional phase (e.g., the threshold voltage compensation phase) to a sense operation may increase the tRCD. In some examples, the threshold voltage compensation phase occurs prior to activation of the wordline WL of the wordlines 260(0)-(N) or 261(0)-(N) associated with a target row of memory cells, including a memory cell of the memory cells 240(0)-(N) or 241(0)-(N).

Figure 3:
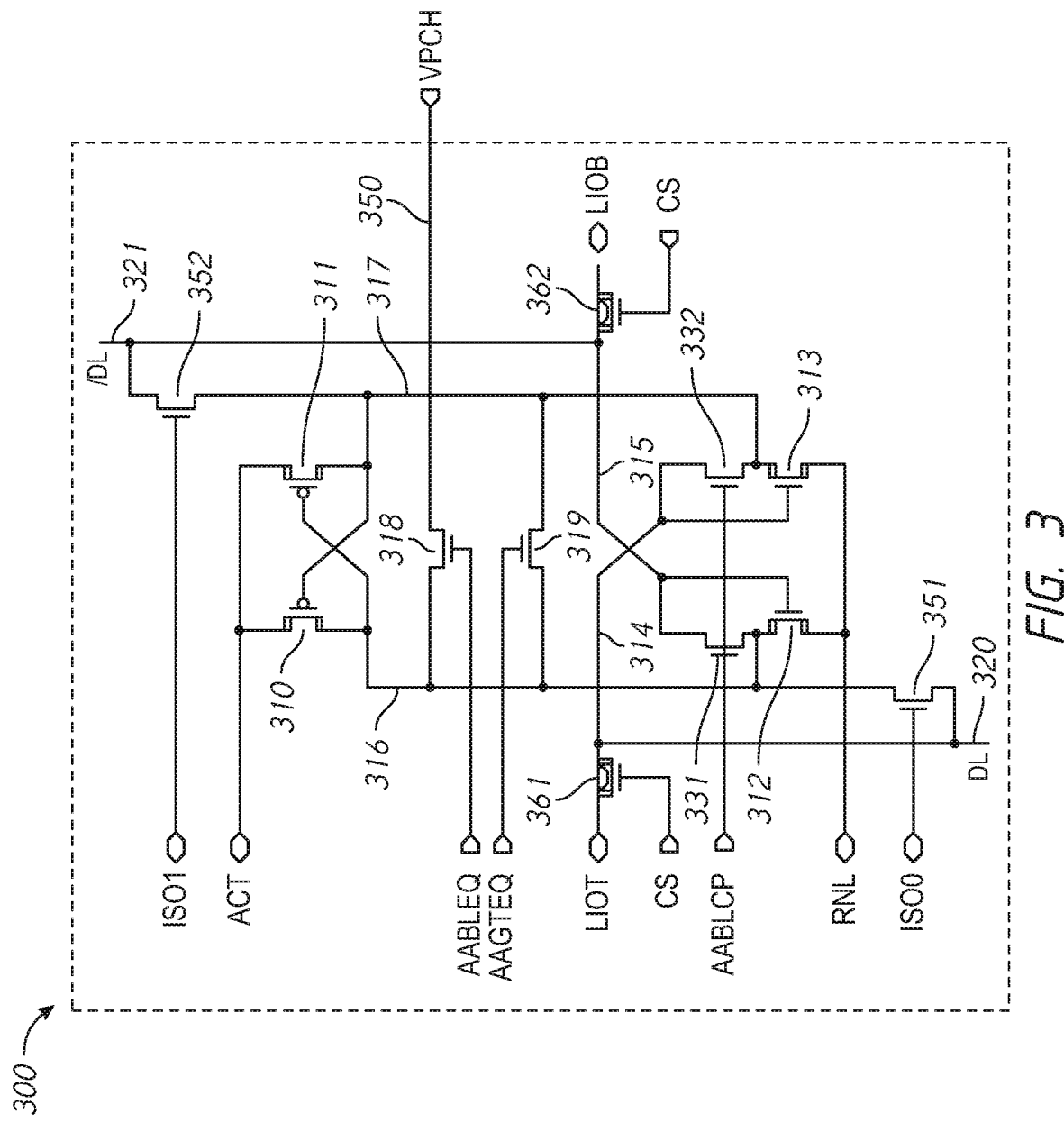
FIG. 3 is a circuit diagram of a sense amplifier in accordance with an embodiment of the disclosure.

However, in another example, the wordline WL of the wordlines 260(0)-(N) or 261(0)-(N) associated with a target row of memory cells may be set to a non-zero offset voltage during the threshold voltage compensation phase to reduce transition during full activation after the threshold voltage compensation phase. In some examples, the non-zero offset voltage may be less than or equal to 0.5 volts. In some examples, the non-zero offset voltage may be a percentage of the wordline WL activation voltage, such as 20% or less of the wordline WL activation voltage. By initially setting the wordline WL to the non-zero offset voltage during the threshold voltage compensation phase, a voltage on the wordline WL may reach the activation voltage of an access device (e.g., one of the access devices 250(0)-(N) and 251(0)-(N)) of the target memory cell (e.g., one of the memory cells 240(0)-(N) or 241(0)-(N)) at an earlier time. The earlier activation of the wordline WL may allow earlier activation of the sense amplifiers 210 to sense and latch a data state the target memory cell, as compared with waiting to initiate activation of the wordline WL until a later time period (e.g., such as after the threshold voltage compensation phase has completed). Thus, by activating the wordlines WL earlier, the sense operation time may be condensed into a shorter time period, and reduce tRCD, FIG. 3 is a circuit diagram of a sense amplifier 300 in accordance with an embodiment of the disclosure. The sense amplifier 300 may be included in one or more of the sense amplifiers 150 of FIG. 1 and/or the sense amplifier 210 of FIG. 2. The sense amplifier 300 may include first type of transistors (e.g. p-type field effect transistors (PFET)) 310, 311 having drains coupled to drains of second type of transistors (e.g., n-type field effect transistors (NFET)) 312, 313, respectively. The first type of transistors 310, 311 and the second type of transistors 312, 313 form complementary transistor inverters including a first inverter including the transistors 310 and 312 and a second inverter including the transistors 311 and 313. The first type of transistors 310, 311 may be coupled to a Psense amplifier control line (e.g., an activation signal ACT), which may provide a supply voltage (e.g., an array voltage VARY) at an active "high" level. The second type of transistors 312, 313 may be coupled to an Nsense amplifier control line (e.g., a Row Nsense Latch signal RNL) that may provide a reference voltage (e.g., a ground (GND) voltage) at an active "low" level. The sense amplifier 300 may sense and amplify the data state applied to sense nodes 314, 315 through the digit (or bit) lines DL 320 and /DL 321, respectively. Nodes 316 and 317 that may be gut nodes coupled to drains of the second type of transistors 312, 313 may be coupled to the digit lines DL 320 and /DL 321 via isolation transistors 351 and 352. The isolation transistors 351 and 352 may be controlled by isolation signals ISO0 and ISO1. The digit lines DL 320 and /DL 321 (sense nodes 314 and 315) may be coupled to local input/output nodes A and B (LIOA/B) through the second type of transistors 361 and 362, respectively, which may be rendered conductive when a column select signal CS is active. LIOT and LIOB may correspond to the LIOT/B lines of FIG. 1, respectively.

The sense amplifier may further include additional second type of transistors 331, 332 that have drains coupled to the sense nodes 315 and 314 and sources coupled to both the gut nodes 316 and 317 and the drains of the second type of transistors 312 and 313. Gates of the second types of transistors 331, 332 may receive a bit line compensation signal AABLCP and may provide voltage compensation for threshold voltage imbalance between the second type of transistors 312 and 313. The sense amplifier 300 may further include transistors 318, 319, where the transistor 318 may couple the gut node 316 to a global power bus 350 and the transistor 319 may couple the gut node 316 to the gut node 317. The global power bus 350 may be coupled to a node that is configured to a precharge voltage VPCH. In some examples, the VPCH voltage is bit line precharge voltage VBLP. In some examples, the VPCH voltage may be set to the VARY voltage during some phases of a sense operation. The voltage of the array voltage VARY may be less than the voltage of the bit line precharge voltage VBLP. In some examples, the bit line precharge voltage VBLP may be approximately one-half of the array voltage VARY. The transistors 318 and 319 may couple the global power bus 350 to the gut nodes 316 and 317 responsive to equilibrating signals AAGTEQ and AABLEQ provided on gates of the transistors 318 and 319.

In operation, the sense amplifier 300 may be configured to sense a data state of a coupled memory cell on the data lines DL 320 and /DL 321 in response to received control signals (e.g., the ISO0/ISO1 isolation signals, the ACT and RNL signals, the AABLEQ and AAGTEQ equalization signals, the CS signal, and the AABLCP signal). The control signals may be provided by a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0-N of FIG. 1), or any combination thereof. A sense operation may include several phases, such as an initial or standby phase, a compensation phase, a gut equalize phase, and a sense phase.

Figure 4:
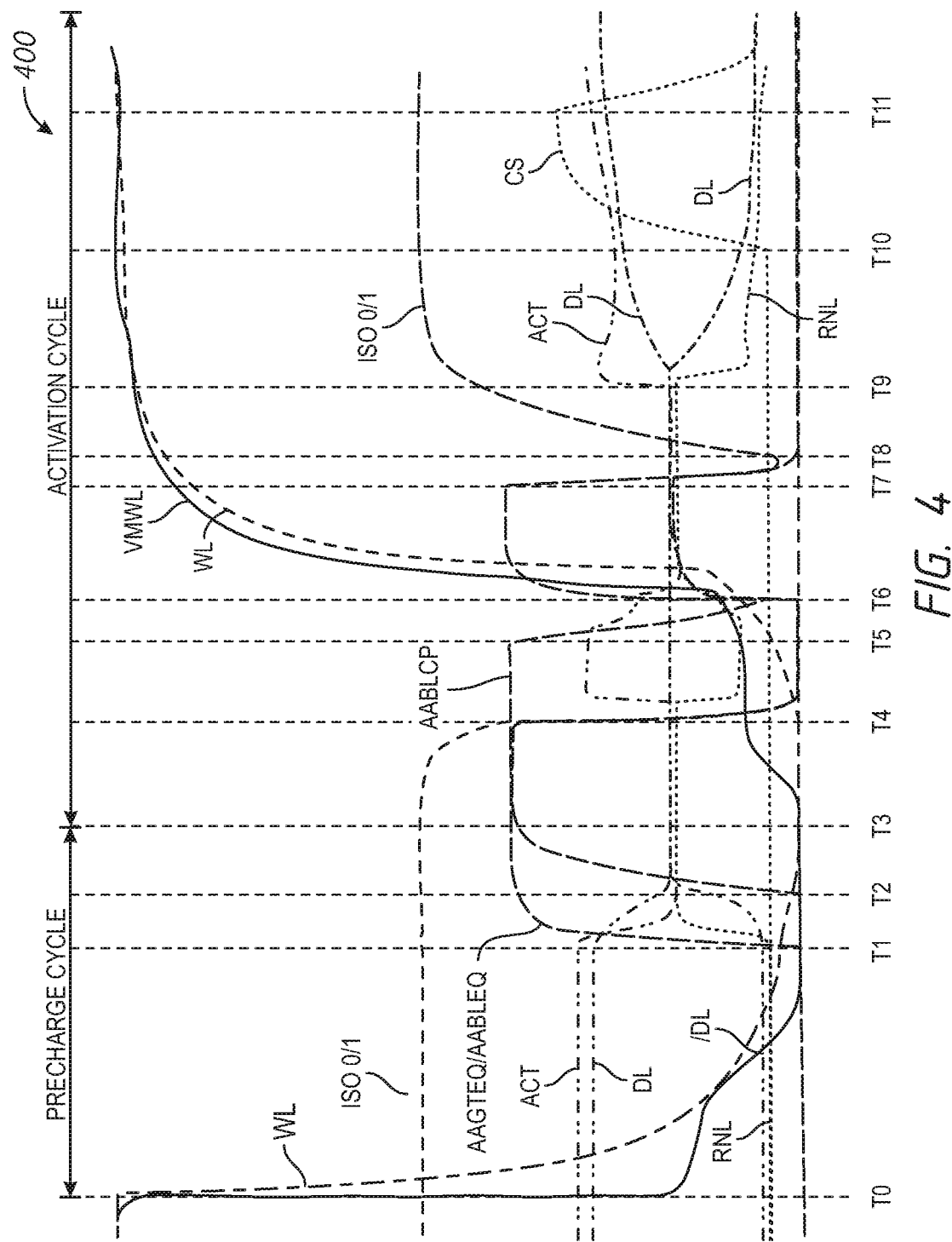
FIG. 4 is an illustration of an exemplary timing diagram depicting signal transition during a sense operation using the sense amplifier in accordance with an embodiment of the disclosure.

FIG. 4 is an illustration of an exemplary timing diagram 400 depicting signal transition during a precharge cycle and an activate cycle using the sense amplifier 300 in accordance with an embodiment of the disclosure. The precharge cycle is from times T0 to T4, and the activation cycle is from times T4 to at least time T11.

During the precharge cycle, the main wordline voltage VMWL (e.g., one of the VMWL1<N:0> or VMWL2<N:0> signals of FIG. 2) may transition to a non-zero offset voltage, and in response the wordline WL may transition an inactive state having the non-zero offset voltage, starting at time T0. In some examples, the wordline WL may be held at the non-zero offset voltage during the precharge phase, as shown. In other examples, the wordline WL may first transition to the non-zero offset voltage and then later transition to a reference or ground voltage during the precharge phase. Transitioning the wordline WL to the non-zero offset voltage may protect attached memory cells from row hammer attacks. At time T0, the digit lines DL 320 and /DL 321 may hold the sense data state from a previous activation phase in response to the ACT signal and the RNL signal being set to the logic high level (e.g., the VARY voltage) and the logic low level (e.g., the GND voltage), respectively. The ISO0/1 signals may remain in an active state from a preceding activation phase. In response to the ISO0/1 signals being in an active state, the transistors 351, 352 may be enabled to couple the digit lines DL 320 and /DL 321 to the gut nodes 316, 317. At time T1, the AAGTEQ and AABLEQ signals may transition to an active state and the ACT signal and the RNL signal may transition to the VPCH voltage (e.g., the VBLP voltage). In response to the AAGTEQ and AABLEQ signals transitioning to the active state, the transistors 318 and 319 may couple the VPCH voltage from the global power bus 350 to each of the gut nodes 316, 317, and in response to the ISO0/1 signals remaining in the active state to enable the transistors 351, 352, the VPCH voltage is also coupled to the digit lines DL 320 and /DL 321 via the gut nodes 316, 317. Thus, starting at time T1, the sense nodes 314 and 315, the gut nodes 316, 317, and the digit lines DL 320 and /DL 321 may start transitioning to the VPCH voltage. The VPCH voltage may be set to the VBLP voltage, in some examples.

At time T2, the AABLCP signal may transition to an active state. In response to the AABLCP transitioning to the active state, the transistors 331, 332 may be enabled to couple the gut node 316 to the digit line /DL 321 and the gut node 317 to the DL 320 in preparation for a threshold voltage compensation operation. Between times T1 and T3, the sense nodes 314 and 315, the gut nodes 316, 317, and the digit lines DL 320 and /DL 321 may transition (e.g., precharge) to the VPCH voltage.

At time T3, the sense amplifier 300 may transition to an activation phase in response to an activate command ACT. During the activation phase, the sense amplifier 300 may perform a sense operation. A sense operation may include several phases, such as an initial or standby phase, a compensation phase, a gut equalize phase, and a sense phase.

During the initial phase (e.g., between times T3 to T4 of the timing diagram 400 of FIG. 4), the gut nodes 316 and 317 may be precharged at the VPCH voltage. For example, the global power bus 350 may be supplied with the VPCH voltage and the AABLCP signal, the ISO0/ISO1 signals, and the AAGTEQ and AABLEQ signals may be in their active states, respectively. Accordingly, while in the initial phase, each of the digit lines DL 320 and /DL 321, the sense nodes 314 and 315 and the gut nodes 316 and 317 may be precharged to the precharge voltage VPCH. In some examples, the VPCH voltage may be the VBLP voltage. The VBLP voltage may be approximately half of the VARY voltage.

After the initial phase, the sense amplifier 300 may enter the threshold voltage compensation phase (e.g., to perform a threshold voltage compensation operation) (e.g., between times T4 and T5 of the timing diagram 400 of FIG. 4), where voltages on the data lines DL 320 and /DL 321 are biased from the VPCH voltage (e.g., VBLP voltage) to compensate (e.g., provide threshold voltage compensation) for threshold voltage differences between the transistors 312, 313. During the threshold voltage compensation phase, at time T1, the ISO0 and ISO1 signals and the AAGTEQ and AABLEQ signals may be set to respective inactive state to disable the transistors 351, 352, 318 and 319. The AABLCP signal may remain in an active state to enable the transistors 331 and 332 to couple the nodes 314 and 315 to the gut nodes 317 and 316, respectively. Additionally, the drain and the gate of the transistor 312 may be coupled and the drain and the gate of the transistor 313 may be coupled. Between time T3 and T4, the VMWL signal may transition to a non-zero offset voltage, and in response, the wordline WL may begin transition to the non-zero offset voltage. The non-zero offset voltage may be 0.5 volts or less, in some examples. In other examples, the non-zero offset voltage may be a percentage of the wordline WL activation voltage, such as 20% or less of the wordline WL activation voltage. Transitioning the wordline WL to the non-zero offset voltage during the threshold voltage compensation phase of a sense operation, rather than holding the wordline WL at a reference or ground voltage until the threshold voltage compensation phase is complete (e.g., after time T5), may reduce tRCD. That is, by starting the wordline WL voltage at the non-zero offset voltage, a time for the wordline WL may reach an activation voltage (e.g.; activate) (e.g., to enable an access device, such as one of the access devices 250(0)-(N) and 251(0)-(N) of FIG. 2, associated with of the target memory cell, such as one of the memory cells MC of FIG. 1 or one of the memory cells 240(0)-(N) or 241(0)-(N) of FIG. 2 at an earlier time. The earlier activation of the wordline WL may allow earlier activation of the sense amplifier 300 to sense and latch a data state the target memory cell, as compared with waiting to initiate activation of the wordline WL from a reference or ground voltage at a later time period (e.g., such as after the threshold voltage compensation phase has completed). Thus, by starting activation of the wordlines WL earlier, the sense operation time may be condensed into a shorter time period, and reduce tRCD. At time T6, the threshold voltage compensation phase may be completed by transitioning the AABLCP signal may to an inactive state, which disables the transistors 331 and 332 and decouples the nodes 314 and 315 from the gut nodes 317 and 316, respectively.

During the gut equalize phase (e.g., between times T6 and T7 of the timing diagram 400 of FIG. 4), the gut nodes 317 and 316 may be decoupled from the digit lines DL 320 and /DL 321 and may be coupled to each other to equalize voltages between the gut nodes 316, 317 to the VPCH voltage. During this phase, at time T6, the AAGTEQ and AABLEQ signals may transition to an active state. While the AABLCP signal is set to the inactive state, the transistors 332 and 331 may decouple the nodes 314 and 315 from the gut nodes 317 and 316. While the equilibrating signals AAGTEQ and AABLEQ are set to the active state, the transistors 318 and 319 may couple the VPCH voltage from the global power bus 350 to the gut nodes 316, 317. While the ISO0 and ISO1 signals are set to the inactive state, the isolation transistors 351 and 352 may decouple the gut nodes 317 and 316 from the digit lines DL 320 and /DL 321. Also at time T6, the VMWL voltage may transition to an activation voltage, and in response, the wordline WL may begin transition to the activation voltage. After the gut nodes 316 and 317 are precharged to the VPCH voltage, the AAGTEQ and AABLEQ signals may be set to inactive states to disable the transistors 318 and 319, at time T7.

During the sense phase (e.g., between times T8 and T11 of the timing diagram 400 of FIG. 4), the sense amplifier 300 may sense a data state of memory cell coupled to the data line DL 320 or /DL 321. At time T8, the ISO0 and ISO1 isolation signals may be set to an active state. At time T9, the ACT signal and the RNL signal may be activated and set to the logic high level (e.g., the VARY voltage) and the logic low level (e.g., the GND voltage), respectively. Responsive to the ISO0 and ISO1 isolation signals transitioning to the active state, the ISO transistor 351 may couple the digit line DL 320 to the gut node 316 and the ISO transistor 352 may couple the digit line /DL 321 to the gut node 317. During the sense phase, sense and amplify operations are then performed with the threshold voltage compensation voltage to balance the responses of the second type of transistors 312 and 313. For example, in response to a memory cell (e.g., one of the memory cells 240(0)-(N) or memory cells 241 (0)-(N) of FIG. 2) being coupled to a digit line DL 320 or /DL 321 through its respective access device (e.g., the respective access device 250(0)-(N) or access device 251 (0)-(N) of FIG. 2), a voltage difference is created between the digit lines DL 320 and /DL 321 (e.g., via the guts nodes 316 and 317). Thus, at time T8, the voltage difference is sensed by the second type of transistors 312, 313 as the sources of the second type of transistors 312, 313 begin to be pulled to ground through fully activated RNL signal, and one of the second type of transistors 312, 313 with a gate coupled to the digit line DL 320 or /DL 321 with the slightly higher voltage begins conducting. When a memory cell coupled to the gut node 316 through the digit line DL 320 stores a high data state, for example, the transistor 313 may begin conducting. Additionally, the other transistor 312 may become less conductive as the voltage of the gut node 317 with the slightly lower voltage decreases through the conducting transistor 313. Thus, the slightly higher and lower voltages are amplified to logic high and logic low voltages while the isolation signals ISO0 and ISO1 in the active state.

After the data state of the memory cell is sensed, and the sense nodes 314, 315 are each pulled to a respective one of the ACT signal and RNL signal voltages, a read may be performed in response to a READ command. For example, at time T10, the CS signal may be activated (e.g., in response to the READ command), the digit lines DL 320 and /DL 321 (e.g., at sense nodes 314 and 315) may be coupled to the LIO nodes (LIOT and LIOB) and the data output may be provided to the LIO nodes. Thus, the data may be read out from the nodes. After a read operation is completed, at time T11, the CS signal may be set to an inactive state. The process may start over for a second sensing operation.

Figure 5:
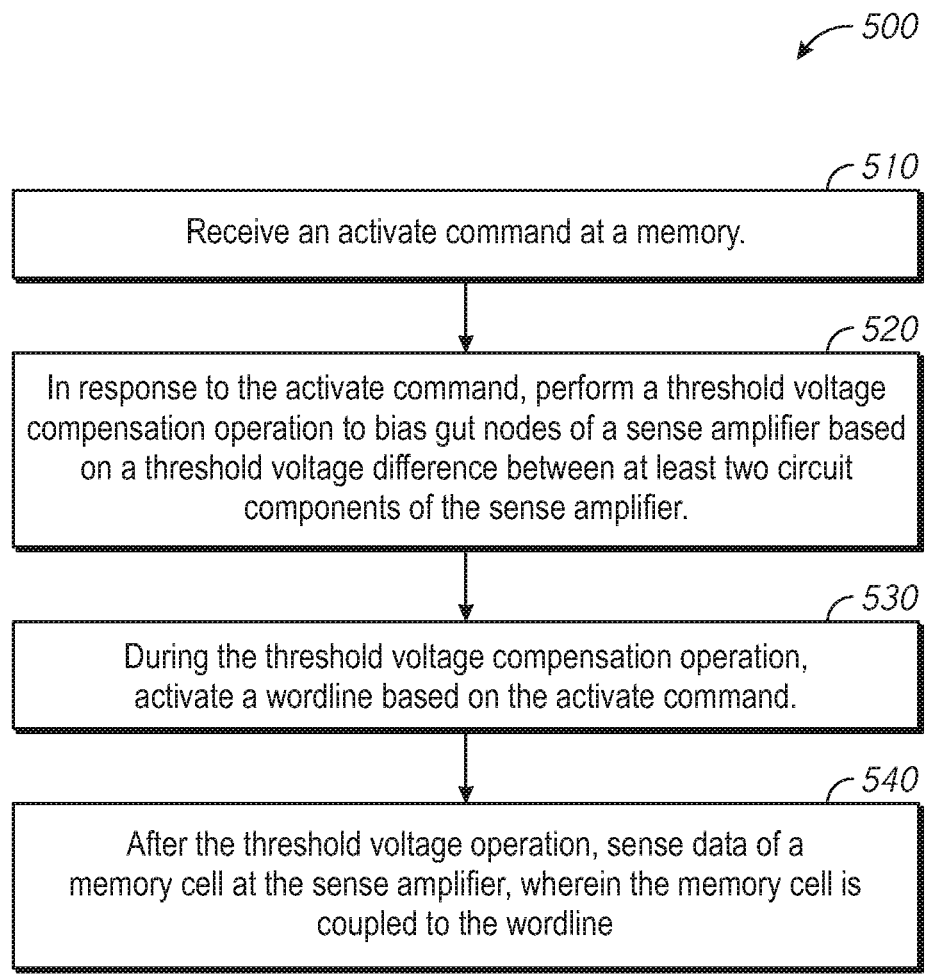
FIG. 5 is a flow diagram of a method for provision of a non-zero offset voltage to a wordline during a threshold voltage compensation operation in accordance with embodiments of the disclosure.

FIG. 5 is a flow diagram of a method 500 for provision of a non-zero offset voltage to a wordline during a threshold voltage compensation operation in accordance with embodiments of the disclosure. The method 500, all or in part, may be performed by the semiconductor device 100, a decoder circuit (e.g., any of the command decoder 125, the row decoder 130, the column decoder 140, any control circuitry of the memory cell array 145 of the memory banks BANK0-N, or any combination thereof) and/or the sense amplifiers 150 of FIG. 1, the sense amplifier 210 of FIG. 2, the sense amplifier 300 of FIG. 3, or combinations thereof.

The method 500 includes receiving an activate command at a memory, at 510. The activate command may be received via a command and address bus, such as the command address bus 110 of FIG. 1. The activate command may be decoded at a command decoder, such as the command decoder 125 of FIG. 1. Activation of the row of memory may occur during a sensing operation, such as during the gut equalization phase described with reference to FIGS. 3 and 4.

The method 500 may further include, in response to the activate command, performing a threshold voltage compensation operation to bias digit lines coupled to a sense amplifier of the memory based on a threshold voltage difference between at least two circuit components of the sense amplifier, at 520. The sense amplifier may include any of the sense amplifiers 150 of FIG. 1, the sense amplifier 210 of FIG. 2, or the sense amplifier 300 of FIG. 3. The digit lines may correspond to any of the BL or /BL of FIG. 1, the digit lines DL 220 or /DL 221 of FIG. 2, or the digit lines DL 320 or /DL 321 of FIG. 3. Biasing of the digit lines may include coupling the gut nodes of the sense amplifier to a respective digit line. The gut nodes may include the gut nodes 316 or 317 of FIG. 3. In some examples, performing the threshold voltage compensation operation to bias the digit lines coupled to the sense amplifier may be based on threshold voltage differences between a first n-type transistor and a second n-type transistor of the sense amplifier, such as threshold voltage differences between the transistors 312 and 313 of FIG. 3.

The method 500 may further include, during the threshold voltage compensation operation, providing a non-zero offset voltage to a wordline based on the activate command, at 530. The wordline may correspond to any of the wordline WL of FIG. 1 or the wordlines WL 260(0)-(N) or 261(0)-(N) of FIG. 2. In some examples, the non-zero offset voltage is less than 20 percent of the wordline activation voltage. In other examples, activation of the wordline based on the activate command may be between and including 0.25 and 1.5 nanoseconds before an end of the threshold voltage compensation operation.

The method 500 may further include, after the threshold voltage operation, providing a wordline activation voltage to the wordline, wherein a data state of a memory cell coupled to the wordline is sensed at the sense amplifier, at 540. Activation of the wordline may cause memory cell to be coupled to a digit line of the digit lines. The memory cell may include the memory cell depicted in FIG. 1 or any of the memory cells 240(0)-(N) or 241(0)-(N) of FIG. 2. Provision of the non-zero offset voltage and the activation voltage may be via main and sub-wordline drivers, such as the main wordline driver 265 of FIG. 2 and/or any of the sub-wordline drivers 262(0)-(N) or 263(0)-(N) of FIG. 2. The memory cell may be coupled to the digit line via an access device, such as any of the access devices 250(0)-(N) or 251(0)-(N) of FIG. 2. In some examples, the method 500 may further include sensing data of a memory cell coupled to the word line at a predetermined time after activation of the wordline. In some examples, sensing data of a memory cell coupled to the word line may occur at a predetermined time after activation of the wordline. That is, the wordline may be given a predetermined amount of time or a predetermined number of clock cycles to charge before data is sensed from the corresponding memory cell. In some examples, the method 500 may further include providing the non-zero offset voltage to the wordline in response to a precharge command.

Figure 6:
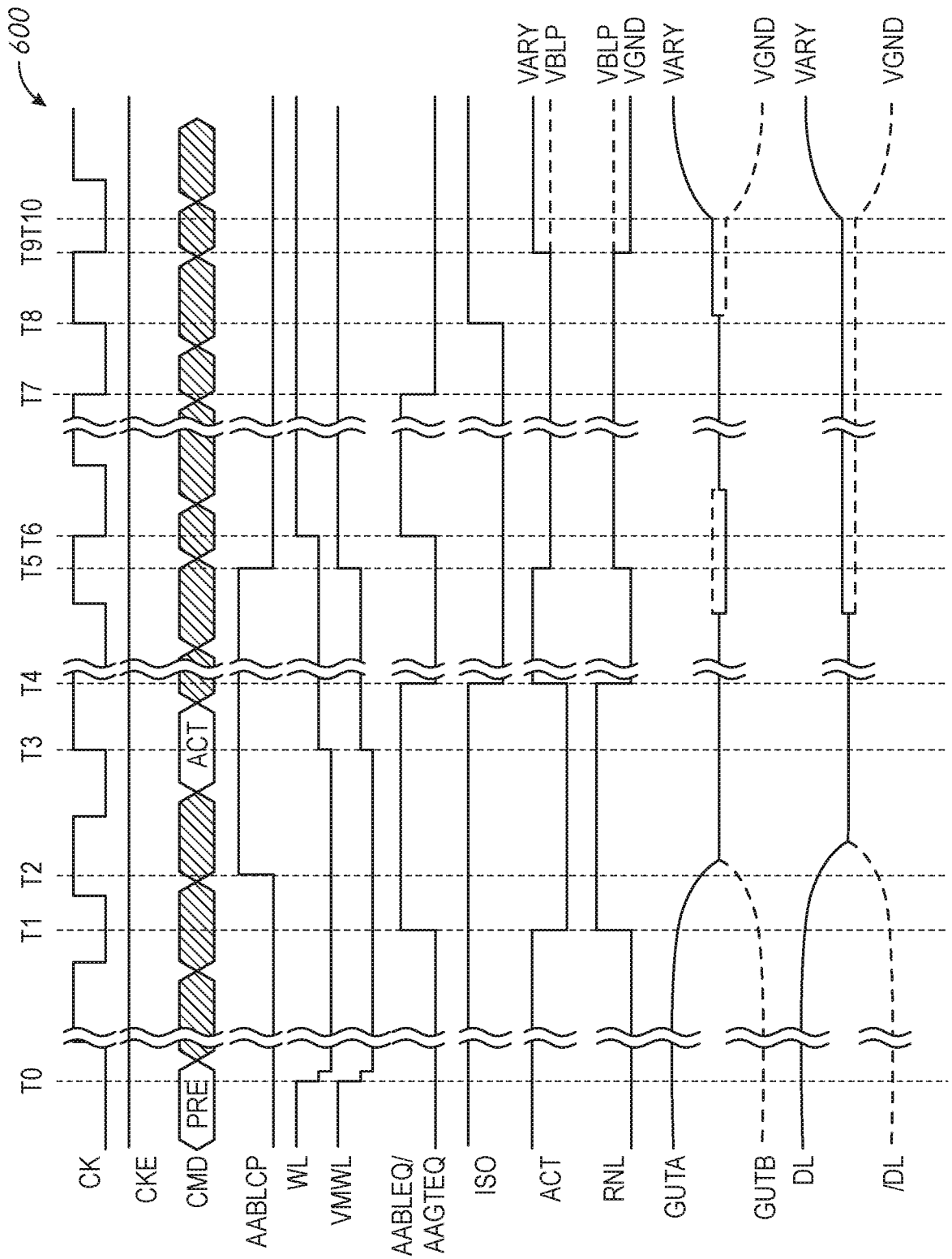
FIG. 6 is an illustration of an exemplary timing diagram depicting transition of a wordline to a non-zero offset voltage during a threshold voltage compensation phase of a sense operation in accordance with embodiments of the disclosure.

FIG. 6 is an illustration of an exemplary timing diagram 600 depicting transition of a wordline to a non-zero offset voltage during a threshold voltage compensation phase of a sense operation in accordance with embodiments of the disclosure. In some examples, the timing diagram 600 may depict operation of the semiconductor device 100 and/or one of the sense amplifiers 150 of FIG. 1, the sense amplifier 210 of FIG. 2, the sense amplifier 300 of FIG. 3, or combinations thereof. The CK and CKE signals may correspond to the CK and CKE signals of FIG. 1. The CMD signal may correspond to a command signal received at via the command and address bus 110 of FIG. 1. The WL signal may correspond to voltages transmitted on the word lines WL of FIG. 1, the word lines WL 260(0)-(N) and word lines WL 261(0)-(N) of FIG. 2. The AABLCP, AABLEQ, AAGTEQ, ISO, ACT, and RNL signals may correspond to the AABLCP, AABLEQ, AAGTEQ, ISO0/1, ACT, and RNL signals of FIG. 3. The GUTA and GUTB nodes may correspond to the gut nodes 316 and 317. The digit lines DL and /DL may correspond to any of the bit lines BL and /BL of FIG. 1, the digit lines DL 220 and /DL 221 of FIG. 2, or the DL 320 or /DL 321 of FIG. 3. The VMWL signal may correspond to one of the VMWL1<N:0> or VMWL2<N:0> signals of FIG. 2.

A sense amplifier may be configured to operate in a precharge phase and an activation phase. The timing diagram 600 depicts a precharge cycle associated with a precharge phase from times T0 to T3, and an activation cycle associated with an activation phase from times T3 to at least time T10.

While the clock enable signal CKE is active, the precharge phase may be initiated at time T0, in response to a precharge command PRE received via the CMD signal responsive to the clock signal CK. In response to the precharge command PRE, the VMWL signal, and in response, the wordline WL may begin transitioning to an inactive state starting at time T0. The VMWL and wordline WL signals may transition to a non-zero offset voltage, in some examples. In other examples, the VMWL and wordline WL signals may transition to reference or ground voltages. In yet other examples, the VMWL and wordline WL signals may initially transition to the non-zero offset voltage and may subsequently transition to a reference or ground voltage. Also at time T0, the digit lines DL and /DL may hold the sense data state from a previous activation phase in response to the ACT signal and the RNL signal being set to the logic high level (e.g., the VARY voltage) and the logic low level (e.g., the GND voltage), respectively. The ISO signal may remain in an active state from a preceding activation phase. At time T1, the AAGTEQ and AABLEQ signals may transition to an active state and the ACT signal and the RNL signal may transition to the VBLP voltage. In response to the AAGTEQ and AABLEQ signals transitioning to the active state, the VBLP voltage may be coupled to each of the GUTA and GUTB nodes, and in response to the ISO signal remaining in the active state, the VBLP voltage may also be coupled to the digit lines DL and /DL via the GUTA and GUTB nodes. Thus, starting at time T1, the GUTA and GUTB nodes and the digit lines DL and /DL may start transitioning to the VBLP voltage.

At time T2, the AABLCP signal may transition to an active state. In response to the AABLCP transitioning to the active state, the GUTA and GUTB nodes may be cross coupled with the digit lines /DL and DL, respectively, in preparation for a threshold voltage compensation operation.

At time T3, the sense amplifier may transition to an activation phase in response to an activate command ACT received via the CMD signal responsive to the clock signal CK. The ACT command may indicate a row of memory cells to be activated via the wordline WL. During the activation phase, the sense amplifier may perform a sense operation. At time T4, the AAGTEQ and AABLEQ signals and the ISO signal may transition to an inactive state, and in response to the ISO signal transitioning to the inactive state, the GUTA and GUTB nodes may be decoupled from the digit lines DL and /DL, respectively. In addition, between time T3 and T4, the VMWL signal, and in response, the wordline WL may begin transitioning to a non-zero offset voltage. The non-zero offset voltage may be 0.5 volts or less, in some examples. In other examples, the non-zero offset voltage may be a percentage of the wordline WL activation voltage, such as 20% or less of the wordline WL activation voltage. Transitioning the wordline WL to the non-zero offset voltage during the threshold voltage compensation phase of a sense operation, rather than holding the wordline WL at a reference or ground voltage until the threshold voltage compensation phase is complete (e.g., after time T5), may reduce tRCD.

At time T5, the AABLCP signal may transition to an inactive state, indicating an end to the threshold voltage compensation phase. In response to the AABLCP signal transitioning to the inactive state, the GUTA node may be decoupled from digit line /DL and the GUTB node may be decoupled from digit line DL. At time T6, the AABLEQ and AAGTEQ signals may transition to an active state to initiate the gut equalization phase. During the gut equalization phase, between times T6 and T7, the GUTA and GUTB nodes of the sense amplifier may be coupled together and to the VBLP voltage. The digit lines DL and /DL may remain offset based on the threshold voltage differences between transistors of the sense amplifier. At time T7, the AABLEQ and AAGTEQ signals may transition to an inactive state to end the gut equalization phase. Also at time T6, the VMWL signal may transition to an active state, and in response, the wordline WL may be set to an active state, which may allow the wordline WL to begin charging to a voltage that enabled an access device to couple a target memory cell to one of the digit lines DL or /DL.

At time T8, the sense phase of the sense operation may commence. During the sense phase, the ISO signal may transition to an active state to couple the GUTA and GUTB nodes to the digit lines DL and /DL, respectively. At time T9, the sense amplifier may be activated (e.g., as indicated by the ACT and RNL signals transitioning to the respective VARY and VGND voltages from a common VBLP voltage). At time T10, the GUTA and GUTB nodes may begin transitioning to the respective VARY and VGND voltages based on a sensed data state of a coupled memory cell (e.g., coupled via the active wordline WL). Similarly, at time T10, the digit lines DL and /DL may begin transitioning to the respective VARY and VGND voltages based on a sensed data state of the coupled memory cell.

In some examples, if a read command READ is received via the command bus, a column select (CS) signal may be activated (e.g., in response to the READ command) after time T10, which may couple the digit lines DL and /DL to local input/output (I/O) lines to read out the data state of the memory cell.

The timing diagrams 400 and 600 are exemplary for illustrating operation of various described embodiments. Although the timing diagrams 400 and 600 depict a particular arrangement of signal transitions of the included signals, one of skill in the art will appreciate that additional or different transitions may be included in different scenarios without departing from the scope of the disclosure. Further, the depiction of a magnitude of the signals represented in the timing diagrams 400 and 600 are not intended to be to scale, and the representative timing is an illustrative example of a timing characteristics.

Figure 7:
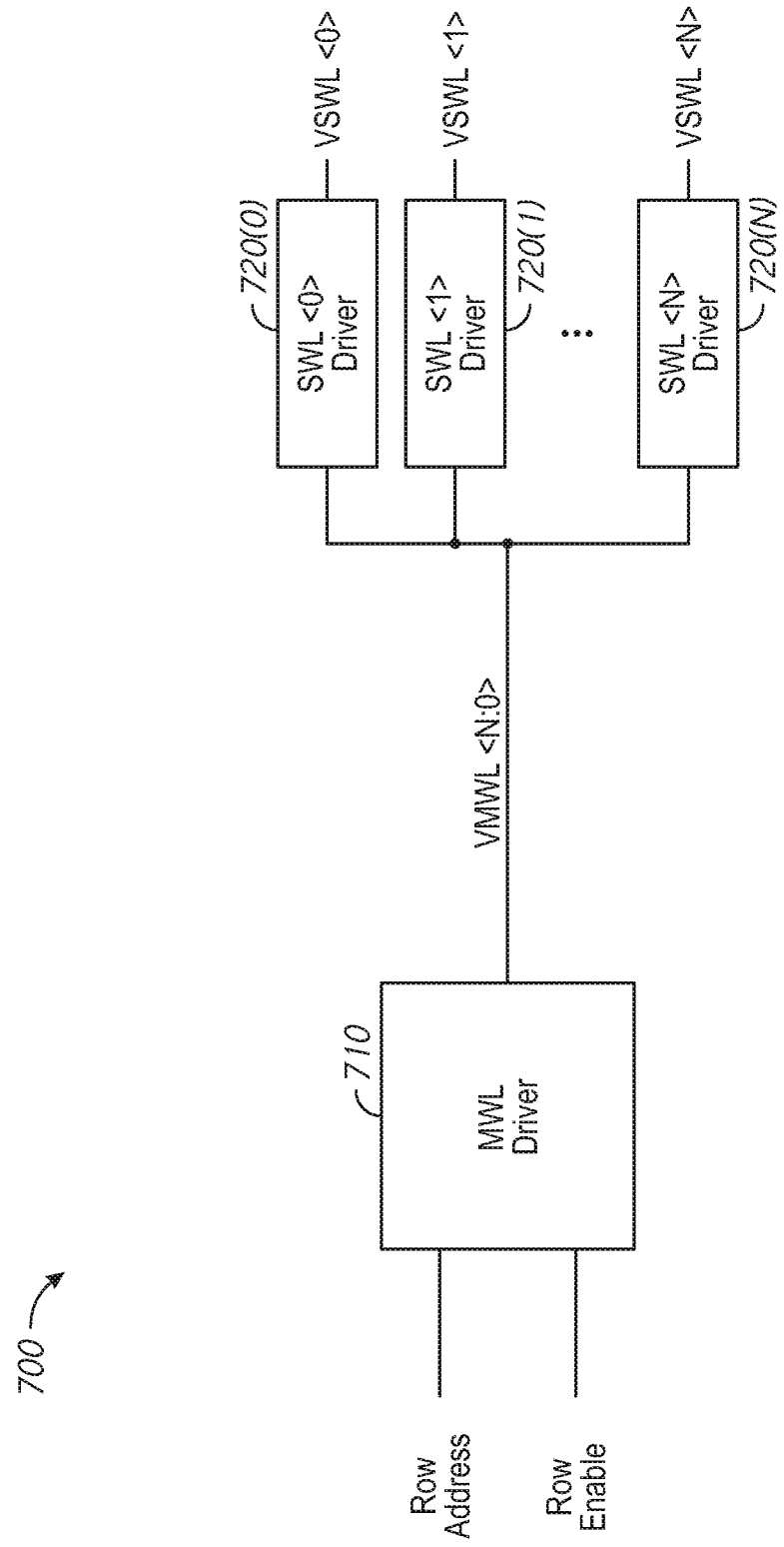
FIG. 7 is a block diagram of an exemplary wordline driver circuit implementation in accordance with an embodiment of the disclosure.

FIG. 7 is a block diagram of an exemplary wordline driver circuit 700 implementation in accordance with an embodiment of the disclosure. The wordline driver circuit 700 may include main wordline drivers 710 configured to provide main wordline signals VMWL<N:0> to sub-wordline drivers 720(0)-(N), respectively. In some examples, the wordline driver circuit 700 may be configured to perform at least a portion of the method 500 of FIG. 5. The main wordline drivers 710 may drive voltages on the VMWL<N:0> signals based on control signals received from decoder circuits, such as any of an address decoder (e.g., the address decoder 120 of FIG. 1), a command decoder (e.g., the command decoder 125 of FIG. 1), a row decoder (e.g., the row decoder 130 of FIG. 1), memory array control circuitry (e.g., the control circuitry of the memory cell array 145 of the memory banks BANK0-N of FIG. 1), or any combination thereof. The main wordline drivers 710 may be implemented in the row decoders 130 of FIG. 1 and/or the main wordline drivers 265 of FIG. 2. The sub-wordline drivers 720(0)-(N) may be implemented in the row decoders 130 and/or control circuitry of the memory cell array 145 of the memory banks BANK0-N of FIG. 1 and/or the sub-wordline drivers 262(0)-(N) and/or the sub-wordline drivers 263(0)-(N) of FIG. 2. The main wordline drivers 710 may be configured to drive a non-zero offset voltage on one or more of the VMWL<N:0> signals during a first time period and to drive an activation voltage on the one or more of the VMWL<N:0> signals during a second time period that follows the first time period. In some examples, the first time period may overlap with a threshold voltage compensation phase of a sense operation. In some examples, the main wordline drivers 710 may be configured to drive a non-zero offset voltage on one or more of the VMWL<N:0> signals in response to a precharge PRE command (e.g., during a precharge phase).

Figure 8:
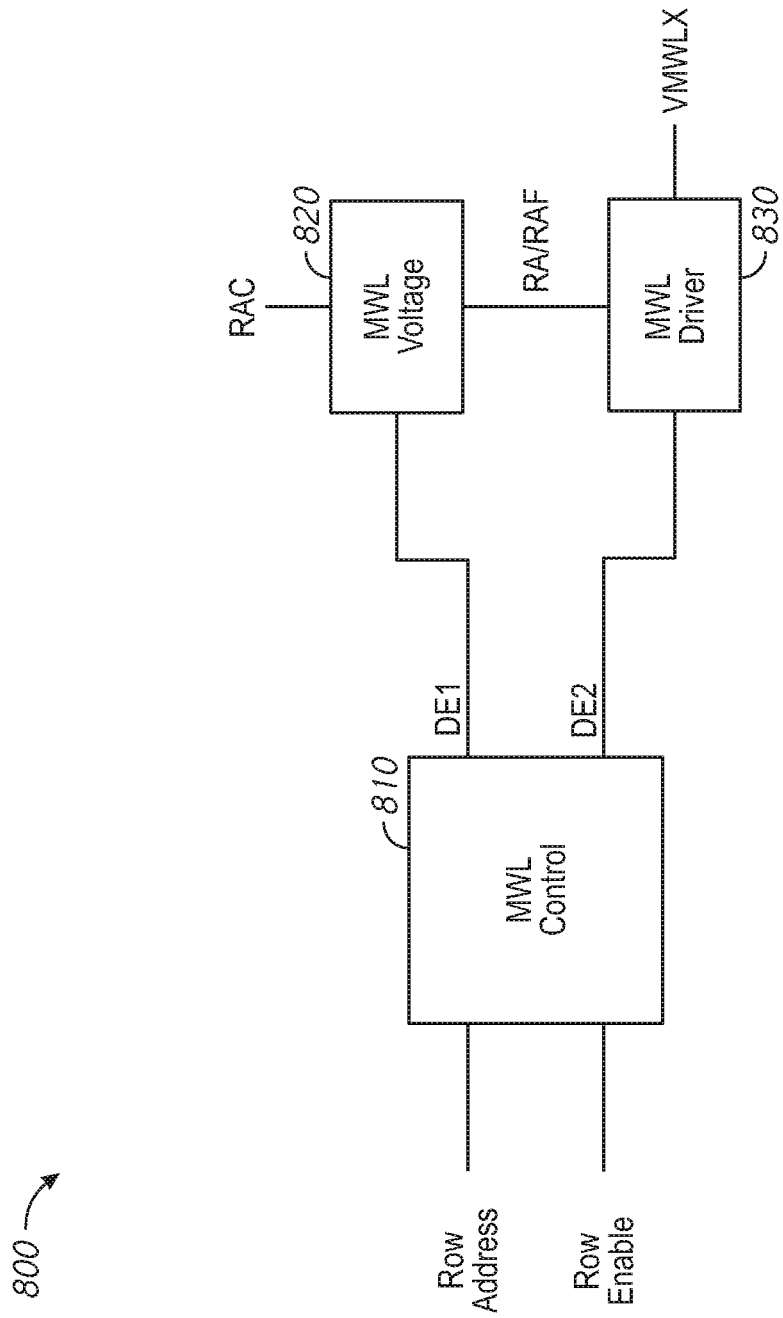
FIG. 8 is a block diagram of an exemplary main wordline driver circuit implementation in accordance with an embodiment of the disclosure.

FIG. 8 is a block diagram of an exemplary main wordline driver circuit 800 implementation in accordance with an embodiment of the disclosure. The main wordline driver circuit 800 may be implemented in the row decoders 130 of FIG. 1, the main wordline drivers 265 of FIG. 2, and/or the main wordline drivers 710 of FIG. 7. In some examples, the main wordline driver circuit 800 may be configured to perform at least a portion of the method 500 of FIG. 5. The 800 may include a main wordline control circuit 810 coupled to a main wordline voltage circuit 820 and a main wordline driver circuit 830. The main wordline control circuit 810 may be configured to receive a row address and a row enable signal and to provide a first driver enable signal DE1 to the main wordline voltage circuit 820 and a second driver enable signal DE2 to the main wordline driver circuit 830. The main wordline voltage circuit 820 may be configured to provide row activate RA and inverted row activate signals RAF to the main wordline driver circuit 830 based on the DE1 signal and a row address control signal RAC.

In response to receipt of the row address, the main wordline control circuit 810 may set the DE2 signal to an active state and the DE1 signal may initially remain in an inactive state. In response to the DE1 signal remaining in an inactive state, the RA signal may be set to the non-zero offset voltage and the RAF signal may be set to an active state based on the RAC signal. In response to the offset voltage on the RA and the active state on the RAF signal the DE2 signal, the main wordline driver circuit 830 may provide the non-zero offset voltage to the VMWLX signal. After a delay, the row enable signal may be set to an active state. In response to the row enable signal being set to an active state, the DE1 signal may be set to an active state. In response to the DE1 signal being set to an active state, the RA signal may be set to an active state and the RAF signal may be set to an inactive state based on the RAC signal. In response to the RA signal being set to the active state and the RAF signal being set to the inactive state, the main wordline driver circuit 830 may provide an activation voltage to the VMWLX signal. The non-zero offset voltage may reduce tRCD during a sense operation and may mitigate a row hammer attack during a precharge phase.

Figure 9:
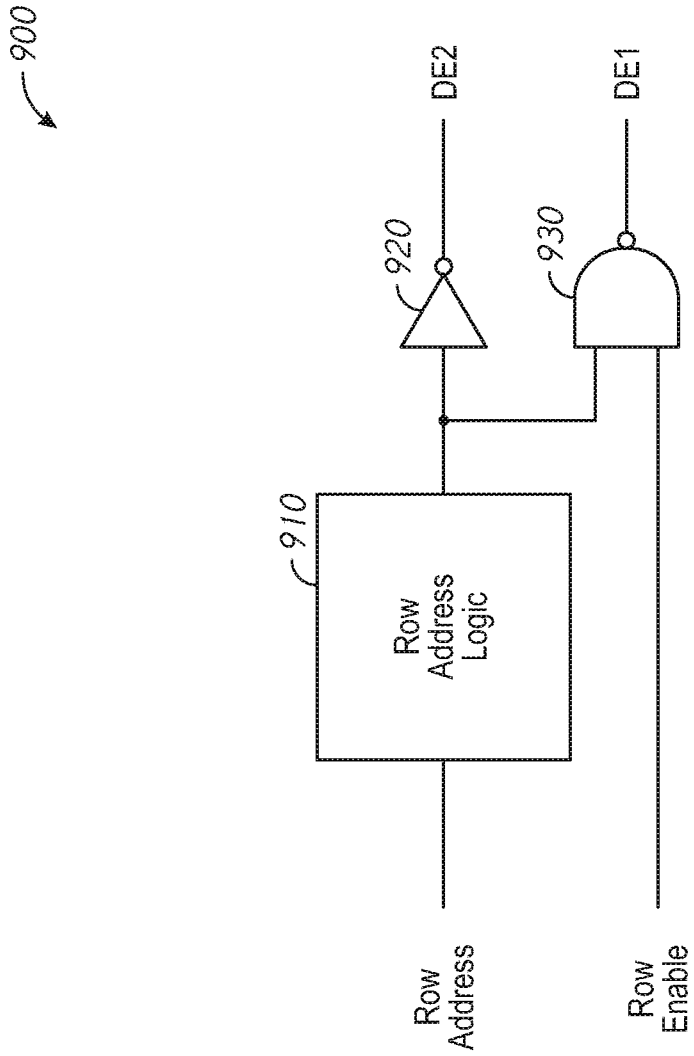
FIG. 9 is a circuit diagram of an exemplary main wordline control circuit implementation in accordance with an embodiment of the disclosure.

FIG. 9 is a circuit diagram of an exemplary main wordline control circuit 900 implementation in accordance with an embodiment of the disclosure. The main wordline control circuit 900 may be implemented in the row decoders 130 of FIG. 1, the main wordline drivers 265 of FIG. 2, the main wordline drivers 710 of FIG. 7, and/or the main wordline control circuit 810 of FIG. 8. In some examples, the main wordline control circuit 900 may be configured to perform at least a portion of the method 500 of FIG. 5. The 900 may include a row address logic 910 coupled to an inverter 920 and a NAND gate 930. The row address logic 910 may be configured to receive a row address signal and to provide an output signal to the inverter 920 and the NAND gate 930. The inverter 920 may invert the output of the row address logic 910 to provide the DE2 signal. The NAND gate 930 may receive a row enable signal and the output of the row address logic 910 and may perform a NAND on the row enable signal and the output of the row address logic 910 to provide the DE1 signal.

Figure 10:
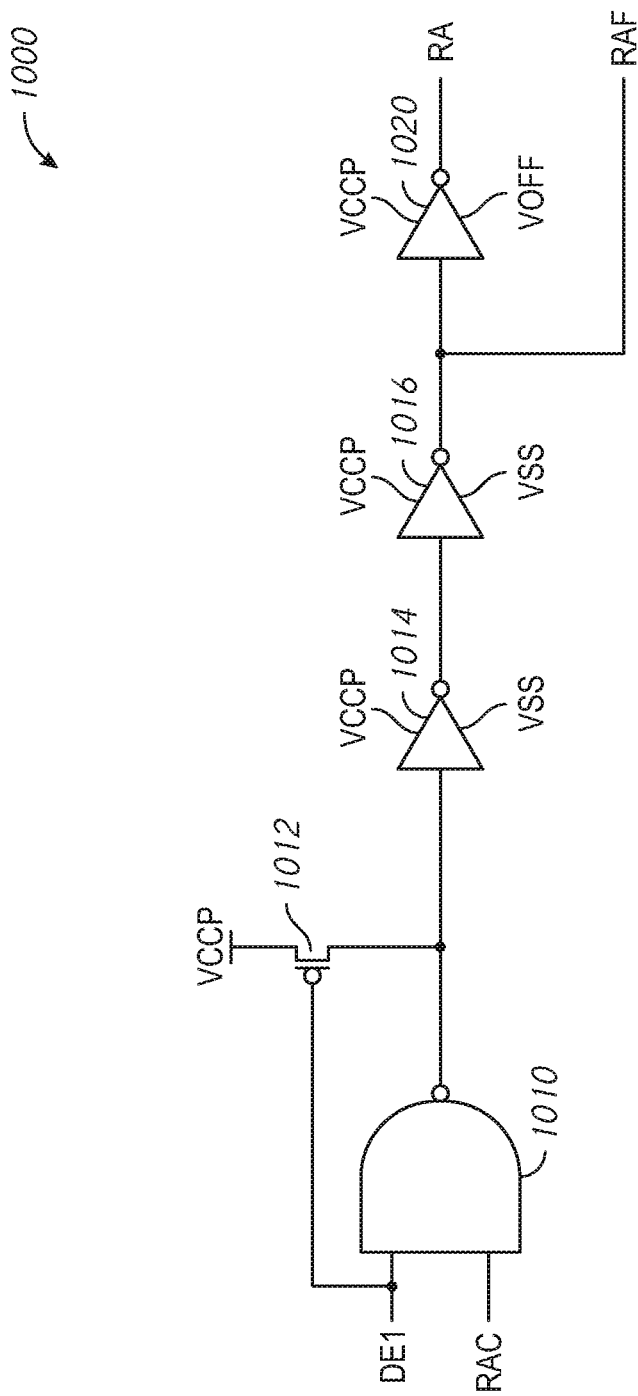
FIG. 10 is a circuit diagram of an exemplary main wordline voltage circuit implementation in accordance with an embodiment of the disclosure.

FIG. 10 is a circuit diagram of an exemplary main wordline voltage circuit 1000 implementation in accordance with an embodiment of the disclosure. The main wordline voltage circuit 1000 may be implemented in the row decoders 130 of FIG. 1, the main wordline drivers 265 of FIG. 2, the main wordline drivers 710 of FIG. 7, and/or the main wordline voltage circuit 820 of FIG. 8. In some examples, the main wordline voltage circuit 1000 may be configured to perform at least a portion of the method 500 of FIG. 5. The main wordline voltage circuit 1000 may include a NAND gate 1010 coupled to serially coupled inverters 1014, 1016, and 1020. The main wordline voltage circuit 1000 may further include a transistor 1012 coupled to a node between the NAND gate 1010 and the inverter 1014. The NAND gate 1010 may receive the DE1 and the RAC signals and perform a NAND operation to provide an output signal to the inverter 1014. The transistor 1012 may receive the DE1 signal at a gate and may provide a VCCP voltage to the node between the NAND gate 1010 and the inverter 1014. The inverters 1014 and 1016 may provide the RAF signal at an output and an input to the 1020. The inverters 1014 and 1016 may be controlled by VCCP (e.g., active state output) and VSS (e.g., inactive state output) voltages. The inverter may provide the nonzero offset voltage VOFF (e.g., inactive state output) or the VCCP voltage to the RA signal based on the output of the inverter 1016. The VOFF voltage may be greater than the VSS voltage. Thus, in operation, when the DE1 signal is set to an inactive state, the transistor 1012 sets the input to the inverter 1014 to an active state. In response, via the inverters 1014, 1016 and 1020, the RAF signal is set to an active state and the RA signal is set to the VOFF voltage. When the DE1 signal and the RAC signals are set to an active state, the NAND gate 1010 sets the input to the inverter 1014 to an inactive state (e.g., the transistor 1012 is disabled). In response, via the inverters 1014, 1016 and 1020, the RAF signal is set to an inactive state and the RA signal is set to an active state.

Figure 11:
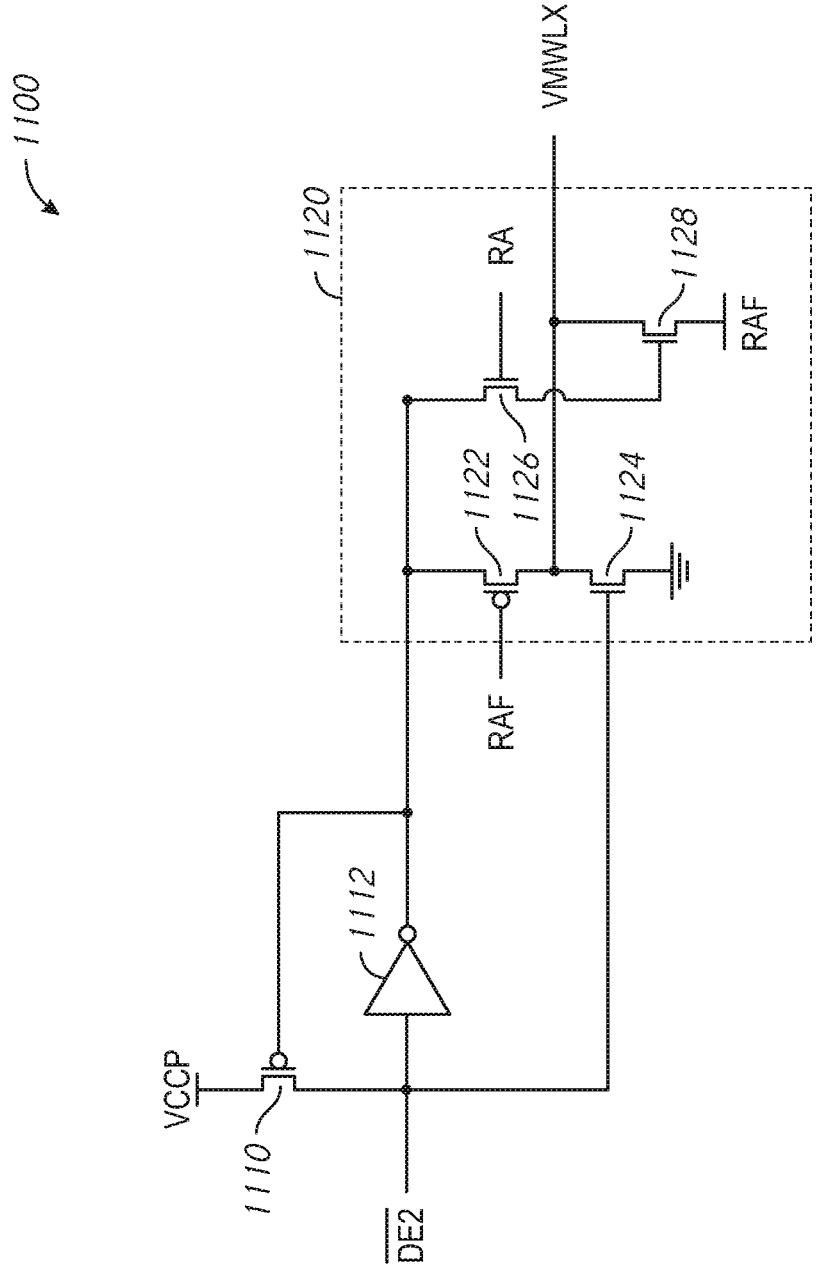
FIG. 11 is a circuit diagram of an exemplary main wordline driver implementation in accordance with an embodiment of the disclosure.

FIG. 11 is a circuit diagram of an exemplary main wordline driver 1100 implementation in accordance with an embodiment of the disclosure. The main wordline driver 1100 may be implemented in the row decoders 130 of FIG. 1, the main wordline drivers 265 of FIG. 2, the main wordline drivers 710 of FIG. 7, and/or the main wordline driver circuit 830 of FIG. 8. In some examples, the main wordline driver 1100 may be configured to perform at least a portion of the method 500 of FIG. 5. The main wordline driver 1100 may be configured to provide the VMWLX signal and includes a transistor 1110 and an inverter 1112 coupled to a driver circuit 1120. The driver circuit 1120 may include serially-coupled transistors 1122 and 1124 and transistors 1126 and 1128. The inverter 1112 may receive and invert the inverted DE2 signal to provide the DE2 signal to the 1020. The transistor 1122 and the transistor 1126 may each be controlled responsive to the RAF signal and the transistor 1124 may be controlled responsive to the inverted DE2 signal. The transistor 1128 may be controlled responsive to the drain of the transistor 1126.

In operation, in response to transition of the inverted DE2 signal to an inactive state at a first time, the inverter 1112 may provide the DE2 signal having an active state to the driver circuit 1120 and to the gate of the transistor 1124. The inactive state inverted DE2 signal may disable the transistor 1124. In response to the RAF signal transitioning to an active state and the RA signal transitioning to the active state (e.g., non-zero offset voltage VOFF), the transistor 1126 may be enabled to provide the active state DE2 signal to the gate of the transistor 1128, and in response the transistor 1128 may provide the VOFF signal from the RA signal to the VMWLX signal. In response to the RAF signal being set to an active state, the transistor 1122 may be disabled. At a second time, the RAF signal may transition to an inactive state and the RA signal may transition to an active state. In response to the RAF signal transitioning to an inactive state and the RA signal transitioning to the inactive state, the transistor 1126 may be disabled, and in response the transistor 1128 may be disabled. In response to the RAF signal being set to the inactive state, the transistor 1122 may be enabled to provide the active state DE2 signal (e.g., activation voltage) to the VMWL signal. Thus, during a first time period, the main wordline driver 1100 may provide the non-zero offset voltage to the VMWL signal and during a second time period, the main wordline driver 1100 may provide the activation voltage to the VMWL signal.

In response to receipt of the row address, the main wordline control circuit 810 may set the DE2 signal to an active state and the DE1 signal may initially remain in an inactive state. In response to the DE1 signal remaining in an inactive state, the RA signal may be set to the non-zero offset voltage and the RAF signal may be set to an active state based on the RAC signal. In response to the offset voltage on the RA and the active state on the RAF signal the DE2 signal, the main wordline driver circuit 830 may provide the non-zero offset voltage to the VMWLX signal. After a delay, the row enable signal may be set to an active state. In response to the row enable signal being set to an active state, the DE1 signal may be set to an active state. In response to the DE1 signal being set to an active state, the RA signal may be set to an active state and the RAF signal may be set to an inactive state based on the RAC signal. In response to the RA signal being set to the active state and the RAF signal being set to the inactive state, the main wordline driver circuit 830 may provide an activation voltage to the VMWLX signal. The non-zero offset voltage may reduce tRCD during a sense operation and may mitigate a row hammer attack during a precharge phase.

Figure 12:
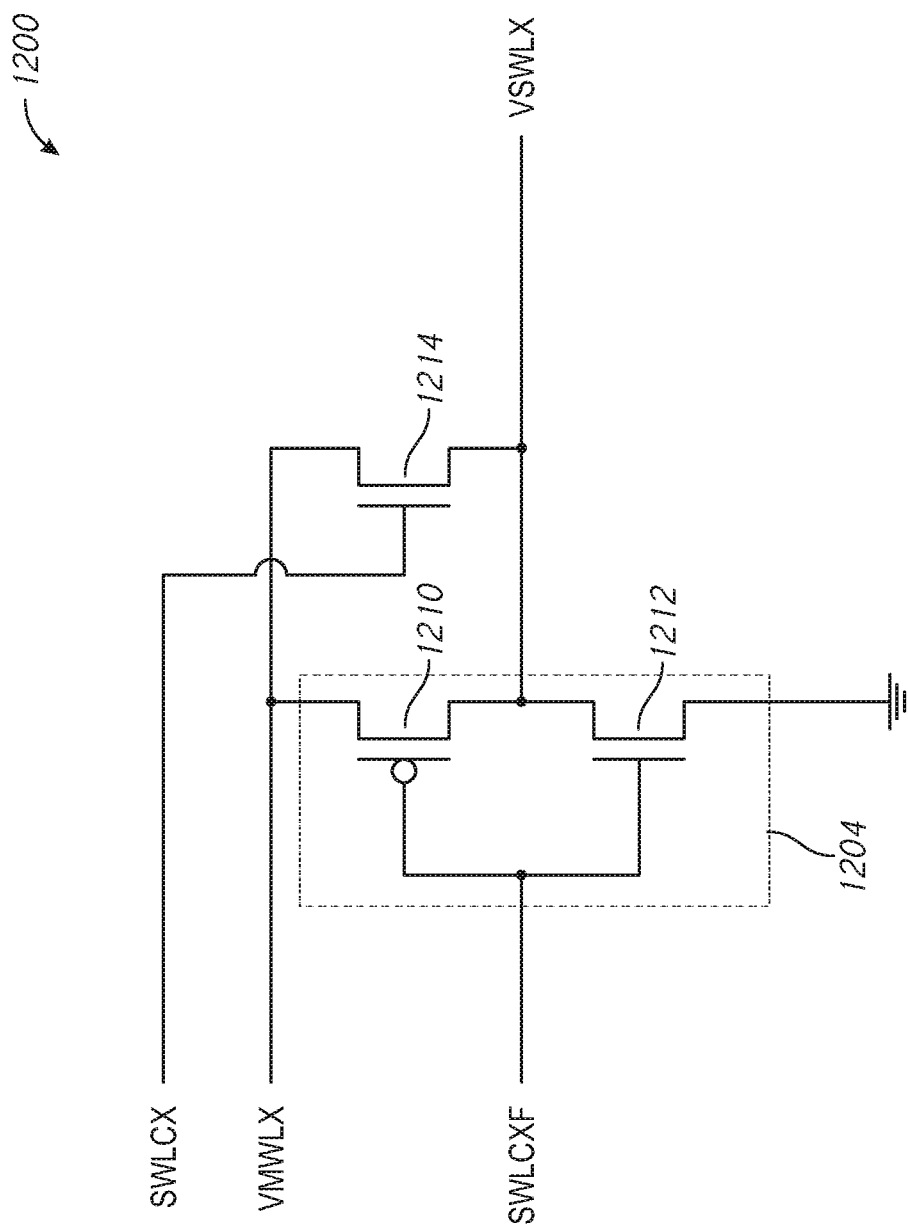
FIG. 12 is a circuit diagram of an exemplary multiplexed sub wordline driver implementation in accordance with an embodiment of the disclosure.

FIG. 12 is a circuit diagram of an exemplary multiplexed sub wordline driver 1200 implementation in accordance with an embodiment of the disclosure. The multiplexed sub wordline driver 1200 may be implemented in the row decoders 130 and/or the memory cell array 145 of FIG. 1, any of the sub wordline drivers 262(0)-(N) or 263(0)-(N) of FIG. 2, and/or any of the 720(0)-(N) of FIG. 7. In some examples, the multiplexed sub wordline driver 1200 may be configured to perform at least a portion of the method 500 of FIG. 5. The multiplexed sub wordline driver 1200 may be configured to provide the VSWLX signal to a respective wordline WL. The multiplexed sub wordline driver 1200 may include an inverter including a transistor 1210 and a transistor 1212 each controlled via a second sub-wordline control signal SWL2X. The multiplexed sub wordline driver 1200 may further include a transistor 1214 controlled via a first sub-wordline control signal SWL1X. In operation, in response to the SWL1X signal transitioning to an active state, the transistor 1214 may be enabled to provide the VMWLX signal voltage to the VSWLX signal. In response to the SWL1X signal transitioning to an inactive state, the transistor 1214 may be disabled. In response to the SW2X signal transitioning to an active state, the transistor 1210 may be disabled to provide the VMWLX signal voltage to the VSWLX signal and the transistor 1212 may be enabled to provide a ground or reference voltage to the VSWLX signal.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
  a memory comprising:
    a memory cell coupled to a first digit line in response to a wordline being set to an active state;
    a sense amplifier coupled to the first digit line and to a second digit line, wherein, during an activation phase, the sense amplifier is configured to perform a threshold voltage compensation operation to bias the first digit line and the second digit line based on a threshold voltage difference between at least two circuit components of the sense amplifier;
    a sub-wordline driver configured to provide a voltage on the wordline, wherein the sub-wordline driver is configured to provide a non-zero offset voltage to the wordline during the threshold voltage compensation operation; and
    a decoder circuit coupled to the wordline and to the sense amplifier, wherein, in response to an activate command, the decoder circuit is configured to transition from a precharge phase to an activation phase and, during the activation phase, to initiate the threshold voltage compensation operation, wherein the decoder circuit is further configured to, during the threshold voltage compensation operation; cause the sub-wordline driver to provide the non-zero offset voltage.

2. The apparatus of claim 1, wherein the sub-wordline driver includes a transistor configured to provide the non-zero offset voltage to the wordline in response to a first control signal provided by the decoder.

3. The apparatus of claim 2, wherein the sub-wordline driver further includes an inverter configured to provide the non-zero offset voltage to the wordline in response to a second control signal provided by the decoder.

4. The apparatus of claim 3, wherein the inverter is further configured to provide the non-zero offset voltage to the wordline in response to the second control signal having a first value and to provide a ground voltage to the wordline in response to the second control signal having the second value.

5. The apparatus of claim 1, wherein the decoder circuit is configured to cause the sub-wordline driver to provide a wordline activation voltage to the wordline after the threshold voltage compensation operation to cause the wordline to transition to the active state.

6. The apparatus of claim 5, wherein the decoder circuit is configured to cause the sense amplifier to perform a sense operation to detect a data state of the memory cell while the wordline is in the active state.

7. The apparatus of claim 1, wherein the memory further comprises a main wordline driver configured to provide the non-zero offset voltage to the sub-wordline driver during the threshold voltage compensation operation and to provide a wordline activation voltage to the sub-wordline driver after the threshold voltage compensation operation.

8. The apparatus of claim 7, wherein the main wordline driver comprises a control circuit configured to cause the non-zero offset voltage to be provided to the sub-wordline driver based on an activate command.

9. The apparatus of claim 1, wherein the sub-wordline driver is further configured to provide the non-zero offset voltage during the precharge phase.

10. The apparatus of claim 9, wherein the decoder is configured to transition to the precharge phase in response to a precharge command.

11. The apparatus of claim 1, rein the at least two components include n-type transistors of the sense amplifier.

12. A method, comprising:
- receiving an activate command at a memory;
- in response to the activate command, transitioning from a precharge phase to an activation phase; and
- during the activation phase:
  - performing a threshold voltage compensation operation to bias digit lines coupled to a sense amplifier of the memory based on a threshold voltage difference between at least two circuit components of the sense amplifier;
  - during the threshold voltage compensation operation, providing a non-zero offset voltage to a wordline based on the activate command; and
  - after the threshold voltage operation, providing a wordline activation voltage to the wordline to activate the wordline, wherein a data state of a memory cell coupled to the wordline is sensed at the sense amplifier.

13. The method of claim 12, wherein the non-zero offset voltage is less than 20 percent of the wordline activation voltage.

14. The method of claim 12, further comprising providing the non-zero offset voltage to the wordline in response to a precharge command.

15. The method of claim 12, further comprising sensing data of a memory cell coupled to the word line at a predetermined time after activation of the wordline.

16. The method of claim 12, further comprising enabling a transistor to provide the non-zero offset voltage to the wordline in response to a first control signal.

17. The method of claim 16, further comprising providing the non-zero offset voltage to the wordline via an inverter in response to a second control signal.

18. The method of claim 17, further comprising:
- providing the non-zero offset voltage to the wordline via the inverter in response to the second control signal having a first value; and
- providing a ground voltage to the wordline via the inverter in response to the second control signal having the second value.

19. The method of claim 12, further comprising, during the threshold voltage compensation operation, biasing digit lines coupled to the sense amplifier based on the threshold voltage difference between two n-type transistors of the sense amplifier.

20. The method of claim 12, further comprising transitioning to the precharge phase in response to a precharge command.

* * * * *

UNITED STATES PATENT AND TRADEMARK OFFICE
CERTIFICATE OF CORRECTION

| | | |
|---|---|---|
| PATENT NO. | : 11,176,978 B2 | Page 1 of 1 |
| APPLICATION NO. | : 17/035462 | |
| DATED | : November 16, 2021 | |
| INVENTOR(S) | : Kawamura | |

It is certified that error appears in the above-identified patent and that said Letters Patent is hereby corrected as shown below:

In the Claims

| | Reads | Should Read |
|---|---|---|
| Column 19, Line 4 | "The apparatus of claim 1, rein the" | -- The apparatus of claim 1, wherein the -- |

Signed and Sealed this
Seventeenth Day of May, 2022

Katherine Kelly Vidal
*Director of the United States Patent and Trademark Office*